United States Patent
Barucci et al.

(10) Patent No.: US 10,260,152 B2
(45) Date of Patent: Apr. 16, 2019

(54) METHOD OF FABRICATING STRUCTURES, STARTING FROM MATERIAL RODS

(71) Applicants: Consiglio nazionale delle ricerche, Rome (IT); CentroFermi Museo Storico della Fisica e Centro Studi e Ricerche, Rome (IT)

(72) Inventors: Andrea Barucci, Rome (IT); Franco Cosi, Rome (IT); Stefano Pelli, Rome (IT); Giancarlo Righini, Rome (IT); Silvia Soria, Rome (IT); Gualtiero Nunzi Conti, Rome (IT); Ambra Giannetti, Rome (IT)

(73) Assignees: CONSIGLIO NAZIONALE DELLE RICHERCHE, Rome (IT); CENTROFERMI MUSEO STORICO DELLA FISICA E CENTRO STUDI E RICERCHE, Rome (IT)

(*) Notice: Subject to any disclaimer, the term of this patent is extended or adjusted under 35 U.S.C. 154(b) by 21 days.

(21) Appl. No.: 15/029,328

(22) PCT Filed: Oct. 10, 2014

(86) PCT No.: PCT/EP2014/071743
§ 371 (c)(1),
(2) Date: Apr. 14, 2016

(87) PCT Pub. No.: WO2015/055526
PCT Pub. Date: Apr. 23, 2015

(65) Prior Publication Data
US 2016/0265120 A1    Sep. 15, 2016

(30) Foreign Application Priority Data
Oct. 15, 2013    (IT) .............................. MI2013A1697

(51) Int. Cl.
*H01L 21/67*    (2006.01)
*H01L 21/461*    (2006.01)
(Continued)

(52) U.S. Cl.
CPC .................. *C23F 1/16* (2013.01); *B05C 3/02* (2013.01); *B05C 3/10* (2013.01); *C03C 25/68* (2013.01);
(Continued)

(58) Field of Classification Search
None
See application file for complete search history.

(56) References Cited

U.S. PATENT DOCUMENTS 4,469,554 A * 9/1984 Turner .................... C03C 15/00
                                                            216/11
6,280,647 B1    8/2001 Muramatsu et al.
(Continued)

FOREIGN PATENT DOCUMENTS

| JP | H06-183766 | * | 7/1994 |
| JP | H06183766 A | | 7/1994 |
| JP | H10132831 A | | 5/1998 |

*Primary Examiner* — Stephanie P Duclair
(74) *Attorney, Agent, or Firm* — John M. Janeway; Janeway Patent Law PLLC

(57) ABSTRACT

A method, and corresponding apparatus, of fabricating a structure by chemical wet etching starting from a material rod of millimetric or sub-millimetric size, the method comprising: dipping an end portion (170) of the material rod (128,129) into a vessel (105) containing an etchant liquid (110) and a protective overlayer (175) floating on top of the etchant liquid, imparting a relative rotational movement of the etchant liquid with respect to the end portion (170) of the material rod immersed therein, wherein said imparting a relative rotational movement comprises imparting to the
(Continued)

etchant liquid a rotational movement component with respect to a static reference system.

11 Claims, 12 Drawing Sheets

(51) Int. Cl.
  *B05C 3/10* (2006.01)
  *B05C 3/02* (2006.01)
  *C03C 25/68* (2006.01)
  *C23F 1/16* (2006.01)
  *G01Q 60/22* (2010.01)
  *G02B 6/26* (2006.01)

(52) U.S. Cl.
  CPC ........... *G01Q 60/22* (2013.01); *H01L 21/461* (2013.01); *H01L 21/67075* (2013.01); *H01L 21/67086* (2013.01); *G02B 6/262* (2013.01)

(56) References Cited

U.S. PATENT DOCUMENTS

| | | | | |
|---|---|---|---|---|
| 6,303,041 | B1* | 10/2001 | Laming | G02B 6/021 216/24 |
| 6,905,627 | B2* | 6/2005 | Wei | C03C 25/68 156/345.11 |
| 2011/0217665 | A1* | 9/2011 | Walsh | C03C 25/626 433/29 |

* cited by examiner

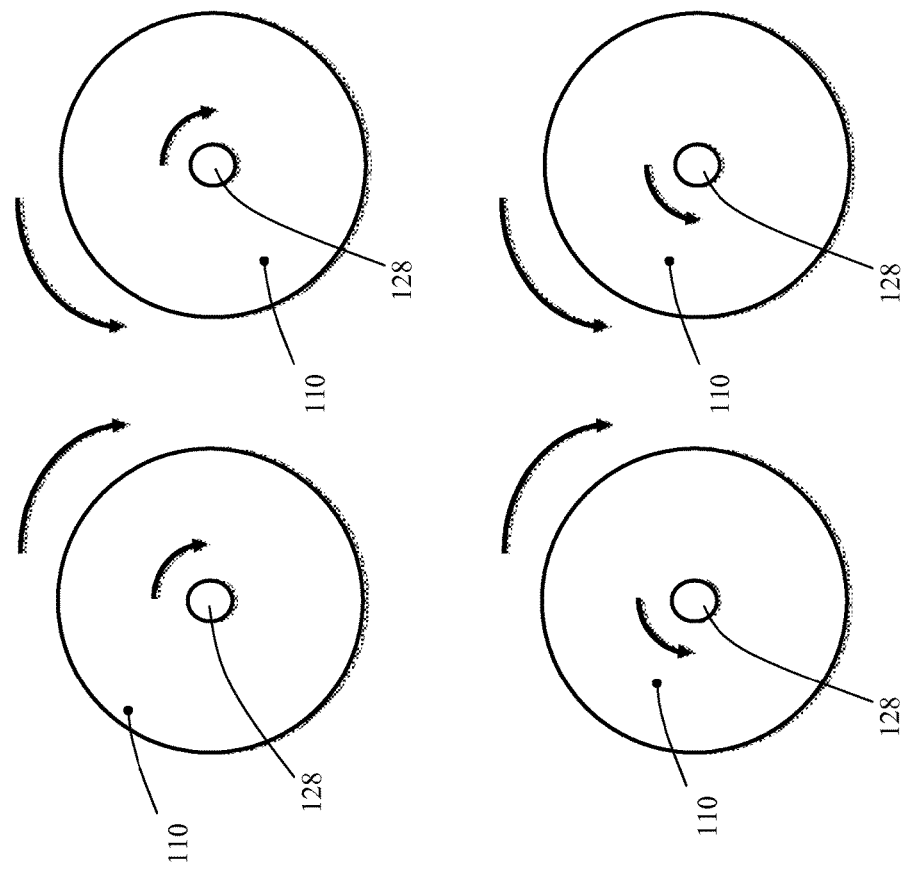
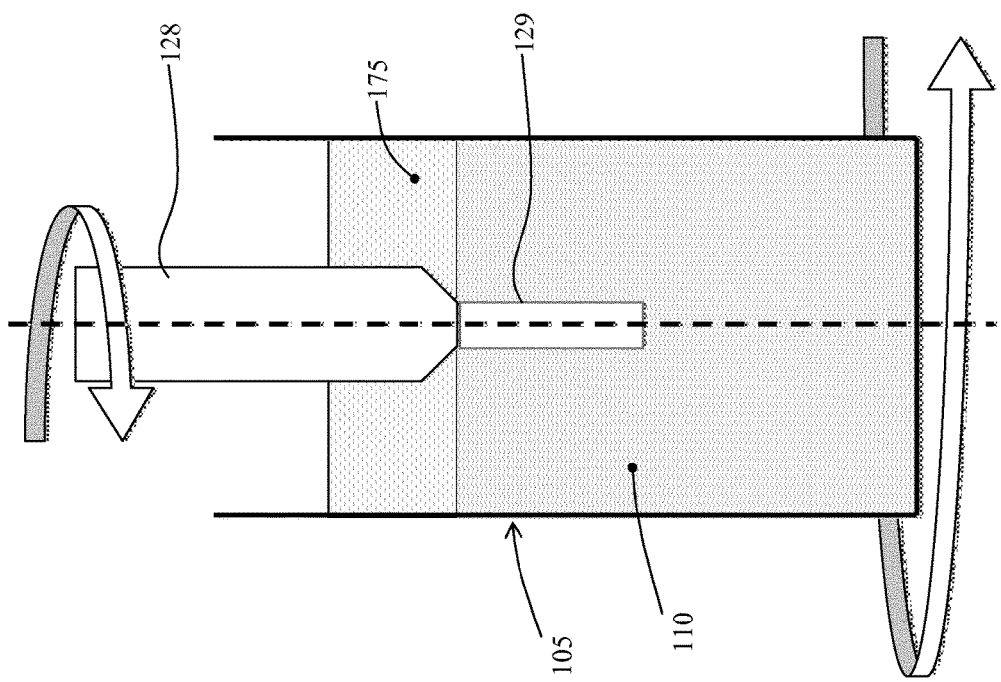
Fig. 2

METHOD OF FABRICATING STRUCTURES, STARTING FROM MATERIAL RODS

BACKGROUND OF THE INVENTION

Field of the Invention

The present invention relates in general to methods of fabrication of structures starting from rods of materials by wet chemical etching. Particularly, the present invention relates to methods of fabrication of structures starting from material rods of millimetric or sub-millimetric size. Embodiments of the present invention relates to the fabrication of nanostructures, i.e. structures having al least one feature size in the nanometric range. Embodiments of the present invention relates in particular to the field of nanoprobes, particularly—although not limitatively—optical fiber probes (hereinafter also referred to as optical nanoprobes).

Overview of the Related Art

Optical fiber probes with small size tips (nanotips) have attracted much interest in the areas of biosensors and Scanning Near-field Optical Microscopy (SNOM)

SNOM is a promising imaging technique overcoming diffraction limits. The probe used by SNOM works in close proximity to the surface and images the sample point by point with a resolution that cannot be achieved by classical optical microscopy. Since the first demonstration of SNOM in 1984 (Pohl D. W. et al, 1984 "Optical stethoscopy: Image recording with resolution $\lambda/20$", Appl. Phys. Lett. 44, 651, 1984), this technique has been applied in various areas.

The resolution of SNOM strongly depends on the quality of the optical fiber probe. In many applications the scanning probe, a nanostructure with sub-wavelength aperture at the apex of a metal-coated tapered glass fiber, is the most delicate component.

Desirable properties of such probes are high transmission, obtained by large cone angles, a well defined circular aperture, no light leaking through pinholes in the metal coating, and a high optical damage threshold.

In general, the smaller the probe tip diameter, the better the achievable spatial resolution. However, the bigger the tip angle, the higher the transmission efficiency. Therefore, a good tip is characterized by a high optical transmission, a small apex diameter and a large cone angle. Theoretical calculations and experiments have shown that optical fiber probes with cone angles ranging from 30° to 50° can simultaneously attain high resolution and high transmission efficiency.

The improvement in the fabrication technique of the optical fiber probes also facilitates obtaining probes suitable for optical fiber biochemical sensing. An advantage of optical fiber sensors is the small size of the optical fibers, which enables intracellular sensing of physiological and biological processes in the nanoenvironment.

To perform true non-invasive intracellular analysis, the sensor must be about 100 times smaller than the analyzed cell. The first submicron optical fiber sensor developed by Kopelman and co-workers in 1992 was for pH measurement using fluorescein as a pH indicator (Tan W., Shi Z-Y, Smith S., Birnbaum D. and Kopelman R., "Submicrometer intracellular chemical optical fiber sensors", Science 258, 778-781, 1992). From then on, more and more miniaturized sensors have been developed for single-cell analysis.

Further increase in the sensitivity of such structures can be obtained by Surface Enhanced Raman Scattering (SERS) or, to obtain better spatial resolution, Tip Enhanced Raman Scattering (TERS) measurements. For SERS, a relatively rough surface of the tip is preferred, so that the metal nanoparticles which produce the enhancement effect can grow on the surface defect sites. On the contrary, for TERS a smooth surface is ideal, in order to concentrate the effect on the metal clad tip.

Most of optical fiber probes are based on tapered optical fibers.

Several methods have been proposed to prepare the tapered glass core necessary for these probes, but essentially all the proposed methods can be divided in two classes: one class includes heating and pulling methods, the other class includes methods based on chemical etching.

In heating and pulling (described e.g. in Valaskovic G. A., Holton M. and Morrison G. H. "Parameter control, characterization, and optimization in the fabrication of optical fiber near-field probes", Appl. Opt. 34, 1215-1234, 1995), the optical fiber is heated by a $CO_2$ laser or a filament and then pulled apart with controlled force, thus producing commonly smooth and long tips. However, it is hard to precisely control the tip diameter and improve the transmission efficiency. Moreover, this technique requires expensive equipment and complicated manipulation.

Chemical etching methods are based on etching glass fibers at the meniscus between hydrofluoric acid and air or an organic overlayer. In comparison to heating and pulling methods, chemical etching allows the production of fiber tips with a shorter cone and a larger cone angle, thereby providing higher optical throughput.

Among all chemical etching methods, static etching, owing to its ease of operation, has been widely employed. Static etching is described in U.S. Pat. No. 4,469,554. A liquid layer is located on top of the etchant (hydrofluoric acid). The liquid in the liquid layer is less dense than the etchant, so that it floats on the etchant. The glass fiber is etched at the meniscus between hydrofluoric acid and the liquid layer. A taper is formed due to a decreasing meniscus height as the fiber diameter is reduced by the etchant. U.S. Pat. No. 4,469,554 also mentions that generally the etchant should etch the material being etched at a reasonable rate and the etch should operate approximately isotropically, although rotation of the material around the cylindrical axis might increase the isotropic nature of the process.

SUMMARY OF THE INVENTION

The Applicant has observed that chemical etching is affected by the etching solution and the environment. Variation of the organic solvent overlayer influences the resulting tip geometry. Also, a problem of etched tips is the sensitivity of the tip shape to the environmental influences such as vibrations, temperature drifts, etc. occurring during the etching process, which result in a glass surface with considerable roughness. This roughness and the asymmetry of the tip apex are generally held responsible for pinholes in the subsequently applied metal coating and ill-defined optical apertures, respectively.

U.S. Pat. No. 4,469,554 states that the taper angle does not depend on the liquid in the liquid layer, but the Applicant has found that, contrary to this statement, by following the method of U.S. Pat. No. 4,495,554 the taper angle that is produced at the tip depends on the choice of the liquid layer, because the properties of the liquid layer determine the shape and contact angle of the meniscus formed.

The Applicant has also found that another problem of chemical etching is that it is difficult to determine the optimal etching time. Although it is generally believed that the process of chemical etching can stop automatically, as stated in U.S. Pat. No. 4,469,554, the Applicant observed that actually it is not so. After the formation of the probe, if it is not removed in a timely manner from the etching solution, hydrofluoric acid can diffuse into the protective layer, which would cause the formation of a rough probe surface due to the emulsion formed at the interface between acid and overlayer.

The Applicant has found that if the surface of the tip is too rough or is marred by other imperfections, then a subsequently applied metal coating, applied to the tip after its formation (as required in some applications of the optical fiber probes), may happen to have pinholes that interfere with the definition of the aperture angle. Irregularities can moreover become starting points for thermal degradation of the applied metal coating, thereby lowering the optical fiber damage threshold and reducing its useful lifetime and performance.

The Applicant has faced the problem of developing a new process for the fabrication, by wet chemical etching, of structures starting from rods of material, particularly rods of millimetric or sub-millimetric size, particularly although not limitatively for the fabrication of nanostructures, e.g. optical fiber probes, that allows producing structures, e.g. nanostructures like nanoprobes with tips (nanotips) having improved quality.

For the purposes of the present invention, by "nanostructure" it is intended a structure having at least one feature size in the nanometric range.

The Applicant has found that the meniscus between an etchant liquid and a solid material rod (e.g., of millimetric or sub-millimetric size), e.g. an optical fiber, to be processed depends on the surface tension of the etchant liquid, on the density of the etchant liquid, on the gravity, and in general on other physical-chemical characteristics of the surface of the solid material rod to be processed. If the etchant liquid is made to rotate, a change in the dynamical behavior of the system occurs, with a change in the local gravity of the etchant liquid due to the centrifugal force, and this causes a change in the shape of the meniscus.

The Applicant has found that, after the (e.g., millimetric or sub-millimetric size) material rod, e.g. the optical fiber, has been immersed into the etchant liquid, by providing a relative rotational movement of the material rod with respect to the etchant liquid, such relative rotational movement comprising an etchant liquid rotational movement component with respect to a static reference system (e.g., the earth), it is possible to obtain structures that are not influenced by environmental disturbances and by the properties of the etchant, e.g. it is possible to obtain nanostructures like optical probes whose tips are not influenced by environmental disturbances and by the properties of the etchant.

For example, the etchant liquid rotational movement component with respect to a static reference system can be achieved by rotating the vessel in which the etchant liquid is contained. Alternatively to, or in combination with, the rotation of the vessel, the etchant liquid in the vessel could be made to rotate with respect to a static reference system by using a magnetic stirrer. Any technique for imposing to the etchant liquid a rotational movement component with respect to a static reference system can be adopted, which allows controlling the nature (laminar or turbulent) of the flow of the etchant liquid.

The Applicant has found that by causing the etchant liquid to rotate with respect to a static reference system, the interaction between the etchant liquid and the material rod, e.g. the optical fiber to be processed is different compared to the case in which there is no relative rotational movement of the material rod, e.g. the optical fiber with respect to the etchant liquid, or there is relative rotational movement of the material rod with respect to the etchant liquid but without a rotational movement component of the etchant liquid with respect to a static reference system (i.e., only the material rod, e.g. the optical fiber, is rotated). If only the material rod, e.g. the optical fiber is rotated, the etchant liquid is put into rotation by the shear stress only by the interaction with the material rod, e.g. the optical fiber (the etchant liquid is dragged by the material rod, e.g. the optical fiber). However, the effect is in such a case restricted to a very limited portion of the etchant liquid, in the neighborhood of the material rod, e.g. the optical fiber, especially in case (as it often is) the size of the vessel containing the etchant liquid (e.g., of a diameter of 1 cm) and that of the material rod, e.g. the optical fiber (e.g., of a diameter of 0.5 mm) are very different. The etchant liquid, being for the large part steady, can still be easily perturbed by external factors (e.g., vibrations).

On the contrary, when the etchant liquid is caused to rotate, the shape of the meniscus between it and the material rod immersed therein is affected and the overall mass of the liquid in movement is less easily perturbed by external factors. This improves the isotropy of the etching process, being less affected by the nature of the etching solution and the environment (vibrations, temperature drifts, etc).

Preferably, a gradual extraction movement of the material rod from the etchant liquid is combined to the relative rotational movement of the material rod with respect to the etchant liquid with an etchant liquid rotational movement component with respect to a static reference system.

This allows to control the end of the etching process, which otherwise would not end automatically, as pointed out above. This allows finely controlling the process of formation of the structures starting from the initial material rods, e.g. for forming nanostructures like nanoprobes.

In addition, the Applicant has found that by causing the etchant liquid to rotate with respect to a static reference system, the material rod etching time is reduced. This could be due to a better efficiency in the diffusion of the etching liquid.

The Applicant has found that this technique is advantageous for fabricating structures like optical fiber nanoprobes and other types of nanostructures starting from millimetric or sub-millimetric size material rods, e.g. capillaries, e.g. for the fabrication nanotips in metal or other materials.

According to an aspect of the present invention, a method is provided of fabricating a structure by chemical wet etching starting from a material rod. The method comprises:
dipping an end portion of the material rod into a vessel containing an etchant liquid and a protective overlayer floating on top of the etchant liquid, and
imparting a relative rotational movement of the etchant liquid with respect to the end portion of the material rod immersed therein.

Said imparting a relative rotational movement comprises imparting to the etchant liquid a rotational movement component with respect to a static reference system.

The Applicant has found that in this way it is possible to produce with high yield nanostructures, like optical fiber probes having nanotips with reproducible shapes. The nanotips can be produced with large cone angles.

The method of the present invention allows to precisely control the surface roughness of the produced structures, e.g. the produced nanotips. The surface roughness of the nanotip can be controlled varying the rotation speed of the etching liquid (e.g., varying the turning velocity of the vessel containing the etchant liquid). Being able to control the surface roughness of the produced structure, e.g. of the produced nanotip is of great importance, because the surface roughness requirements vary depending on the applications the nanotips are intended for. For example, depending on the applications, the surface roughness can be drastically reduced, down to the nanometric range. Moreover, the surface roughness can be made essentially uniform everywhere along the nanotip. The limited surface roughness that can be achieved enhances the adhesion of coating layers (e.g., of metal), and enhances the capacity of the nanotip to be functionalized for specific applications thereof, e.g. by chemically coating the nanotip with antibodys, as required in some applications. The reduced surface roughness and the shape of the nanotip that can be manufactured by the method of the present invention are optimal for TERS (Tip Enhanced Raman Scattering) applications.

Moreover, the quality of the produced nanotips is insensitive to the protective layer, insensitive to vibrations fluctuations during the etching process, insensitive to temperature fluctuations during the etching process, and is independent on the protective layer used.

The deposition probability of debris originating from the etching process on the nanotip surface is also lowered. The action of the rotating etchant liquid smooths the surface of the nanotip.

Thanks to the smooth glass surface, the metal coating applied subsequently to the produced nanotip is virtually free of pinholes.

The method of the present invention can be used without any substantial modification to any kind of optical fibers (the method applies to both single-mode and multi-mode optical fibers).

The method of the present invention also allows obtaining structures, e.g. nanotips with an asymmetrical shape with predefined geometry requirements: while for obtaining symmetrical nanotips the material rod is dipped into the etchant liquid with the starting material rod longitudinal axis orthogonal to the etchant liquid surface, dipping the material rod with its axis slanted with respect to the surface of the etchant liquid allows obtaining a variety of asymmetrical nanotips. Another way for forming asymmetrical structures, e.g. asymmetrical nanotips, is dipping the material rod into the etchant liquid with the material rod longitudinal axis not aligned to (spaced-apart from) the axis of the vessel containing the etchant liquid: as a result, the etchant liquid flows in a different way at the two sides of the material rod, and the meniscus between the etchant liquid and the material rod is different at the two sides of the material rod.

Last but not least, the method of the present invention can be practiced at very low cost.

According to an embodiment of the present invention, the relative rotational movement of the material rod, e.g. the optical fiber with respect to the etchant liquid comprises, in addition to the etchant liquid rotational movement component with respect to a static reference system, a material rod rotational movement component with respect to said static reference system.

The combination of etchant liquid rotational movement and material rod rotational movement leads to a situation like the Taylor-Couette flow. In such a case, different types of flow (laminar, turbulent, etc.) of the etchant liquid depend on the ratio of the radius of the material rod to the radius of the vessel containing the etchant liquid, and the ratio of the respective angular speeds. A desired type of flow can be established by designing the vessel so to have a certain ratio of material rod radius to the vessel radius, and a certain ratio of the respective angular speeds.

In case the material rod is an optical fiber, the method may advantageously comprise:
propagating an optical radiation through the optical fiber;
detecting a transmitted and/or scattered and/or back-reflected optical radiation, respectively transmitted and/or scattered and/or back-reflected at an optical fiber tip of the optical fiber immersed in the etchant liquid to monitor a process of formation of said tip.

Said detecting the transmitted and/or scattered and/or back-reflected optical radiation may comprise comparing an intensity of the transmitted and/or scattered and/or back-reflected optical radiation to predetermined patterns.

According to another aspect of the present invention, an apparatus is provided for fabricating a structure by chemical wet etching starting from a material rod, the apparatus comprising:
a vessel for containing an etchant liquid and a protective overlayer floating on top of the etchant liquid, and for dipping thereinto an end portion of the material rod,
means for imparting a relative rotational movement of the etchant liquid with respect to the end portion of the material rod.

Said means for imparting said relative rotational movement comprises means for imparting to the etchant liquid a rotational movement component with respect to a static reference system.

The apparatus preferably comprises means for gradually extracting the end portion of the material rod from the etchant liquid.

Advantageously, in case the material rod is an optical fiber, the apparatus may comprise means for propagating an optical radiation through the material rod being processed, and means for detecting a transmitted and/or scattered and/or back-reflected optical radiation, respectively transmitted and/or scattered and/or back-reflected at an optical fiber tip of the optical fiber immersed in the etchant liquid to monitor a process of formation of said structure.

Said detecting means for detecting the transmitted and/or scattered and/or back-reflected optical radiation may comprise means for comparing an intensity of the transmitted and/or scattered and/or back-reflected optical radiation to predetermined patterns.

BRIEF DESCRIPTION OF THE DRAWINGS

These and other features and advantages of the present invention will be best understood by reading the following detailed description of exemplary embodiments thereof while referring to the attached drawings, wherein:

FIG. 2 schematically shows four possible combinations of rotational movement of a vessel containing an etchant liquid and an optical fiber immersed therein for the fabrication of an optical fiber probe, according to an embodiment of the present invention;

DETAILED DESCRIPTION OF EXEMPLARY EMBODIMENTS OF THE INVENTION

Figure 1:
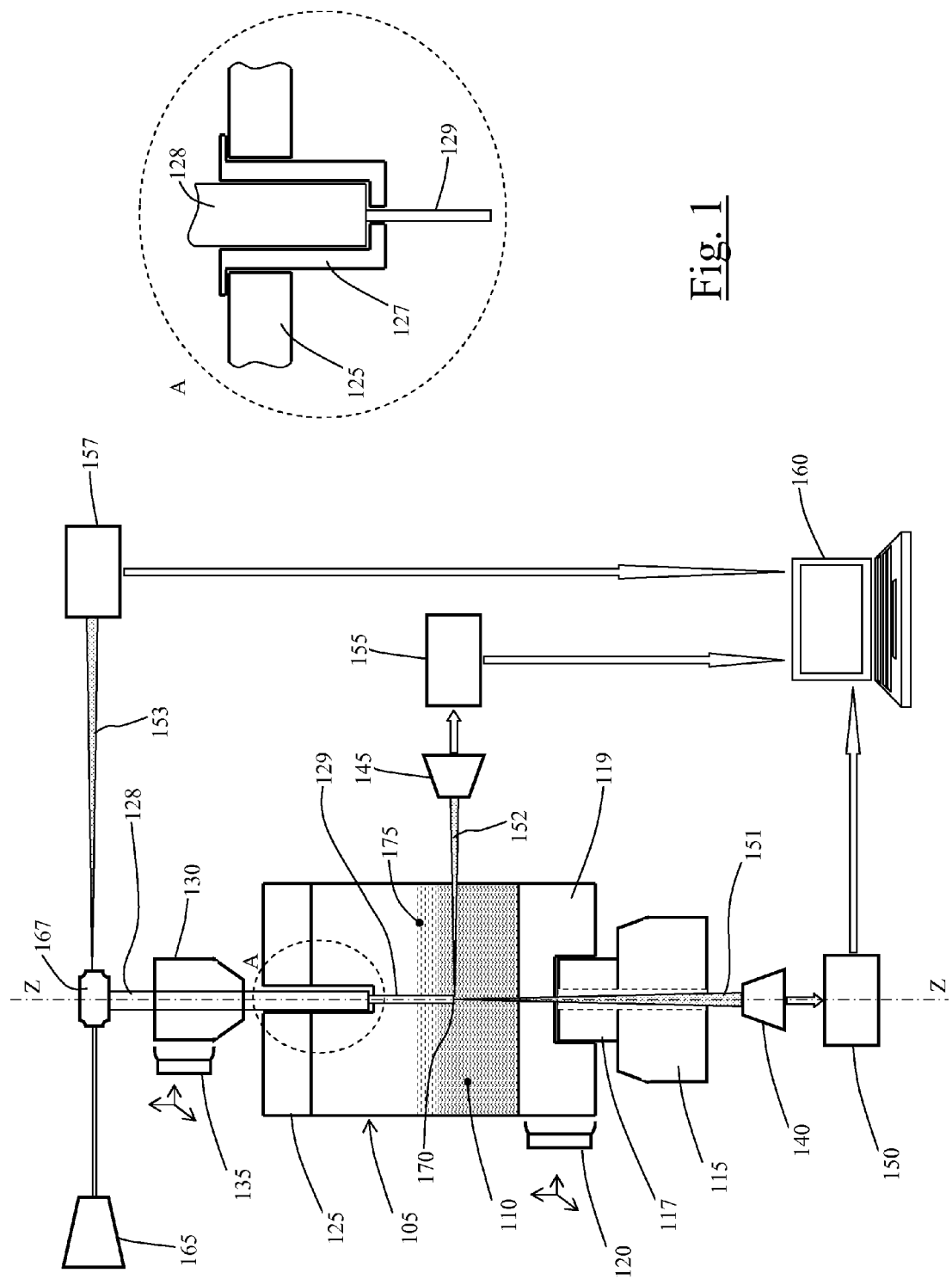
FIG. 1 schematically shows a set-up, according to an embodiment of the present invention, for producing structures, e.g. optical fiber probes, by a method according to an embodiment of the present invention.

Making reference to the drawings, FIG. 1 schematically shows a set-up, according to an embodiment of the present invention, for producing structures, e.g. optical fiber probes, starting from material rods, by means of a method according to an embodiment of the present invention.

A vessel 105, e.g. a plastic cuvette, is provided to contain an etchant liquid 110, for example an aqueous solution of hydrofluoric acid (HF). The vessel 105 is associated with a drive mechanisms comprising a motor 115 (e.g. an electric motor) that, via a transmission, e.g. a shaft 117, is operable to cause the vessel 105 to rotate around a rotation axis coinciding with a vessel longitudinal (vertical) axis Z. In the example schematically shown in the drawings, the motor shaft 117 engages directly the vessel 105 at a bottom portion 119 thereof, however other types of motion transmission are possible, e.g. indirect transmissions exploiting gears or belts. A micropositioner 120 comprising a micromotor is preferably provided for precisely positioning the vessel 105 along the vertical axis Z thereof, as well in a horizontal plane.

A cap 125 is provided for closing the vessel 105 at the top thereof, e.g. by screwing the cap 125 to the vessel 105. The cap 125 is perforated, preferably at the center thereof, and, as schematically shown in the enlarged detail A in FIG. 1, a material rod guide member 127 is inserted in the preferably central hole of the cap 125, for guiding a material rod 128, in the example an optical fiber, to be processed. In the example here described, the guide member 127, preferably made of Teflon, has an internal diameter corresponding to that of a coated optical fiber 128 and extends downwards into the vessel 105 less than the level of filling thereof with the etchant liquid 110. At the bottom, the guide member 127 has a small through hole, of diameter corresponding to that of an uncoated optical fiber 129. For example, the internal diameter of the guide member 127 is of about 1 mm in case a diameter of a coated multi-mode optical fiber 128 to be processed is 980 µm, and the diameter of the through hole at the bottom of the guide member 127 is of about 500 µm for a diameter of the uncoated multi-mode optical fiber 129 of 480 µm. Different diameters of the guide member 127 and of the through hole at the bottom thereof are possible, depending on the diameter of the material rod to be processed, e.g. depending on the diameter of the coated and uncoated optical fiber to be processed. More generally, the guide member 127 should have an internal diameter that is slightly greater than the diameter of the material rod to be processed; the trade off for the diameter of the guide member 127 is between the guiding performance of the material rod to be processed, and the friction between the latter and the internal wall of the guide member 127.

In an embodiment of the invention, a motor 130 (e.g. an electrical motor) is provided for imparting a rotation of the material rod, e.g. optical fiber 128, 129 to be processed, around its longitudinal axis.

Preferably, a micropositioner 135 comprising a micromotor is provided for precisely positioning the material rod 128, 129 e.g. the optical fiber to be processed, along an axis parallel to the vertical axis Z, as well in a horizontal plane. The micropositioner 135 and/or the micropositioner 120 allow, either separately or jointly, to achieve a precise alignment of the optical fiber 128, 129 to be processed to the vertical axis Z of the vessel 105, as well as other alignments.

Figure 3:
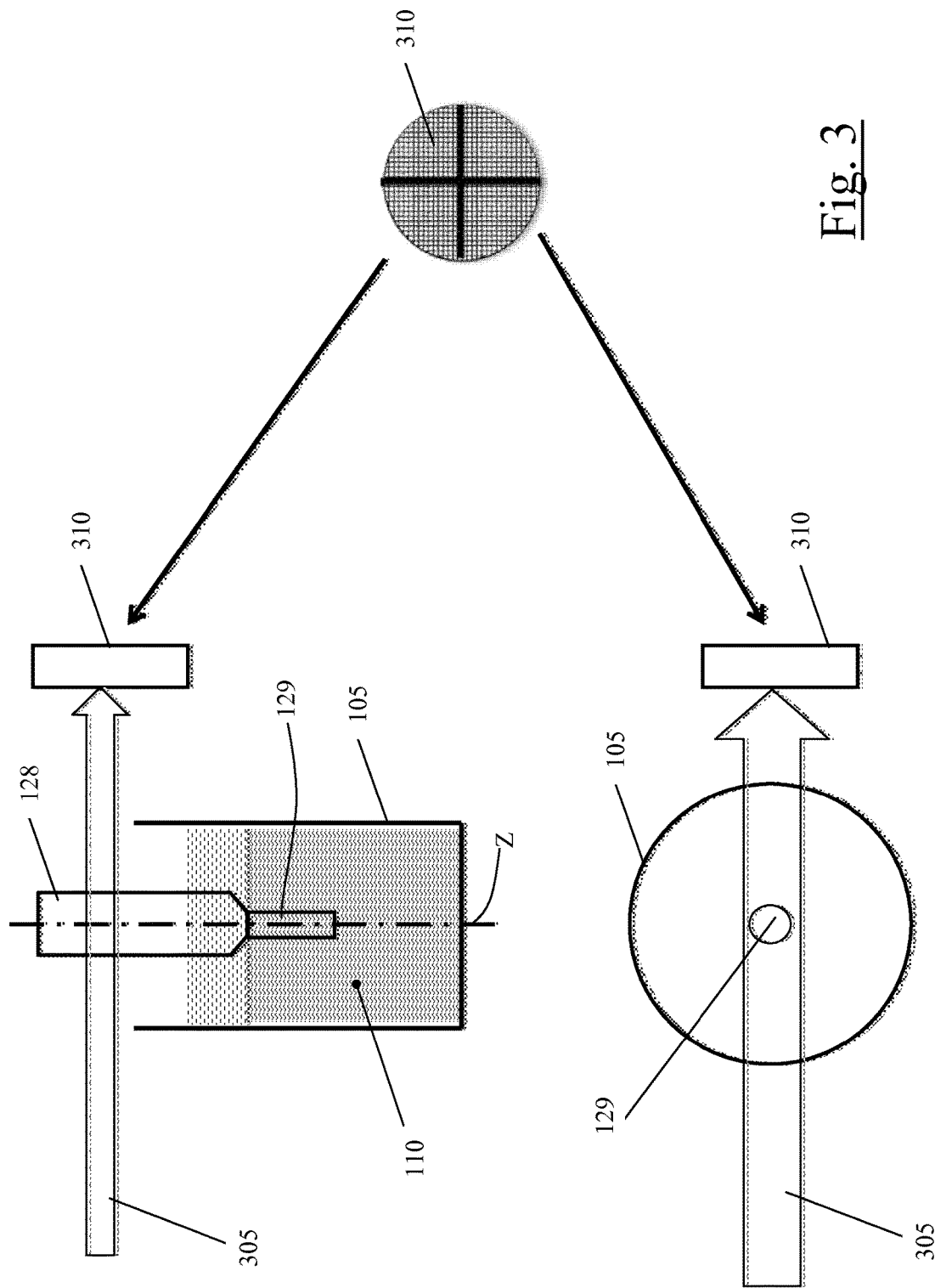
FIG. 3 schematically shows an arrangement for optically controlling the centering of the optical fiber with respect to the vessel.

The alignment of the optical fiber 128, 129 to be processed can be automatically controlled by means of an optical control system, schematized in FIG. 3. A laser beam 305 having a transverse size greater that that of the uncoated optical fiber 129 is caused to hit the optical fiber 129 and then captured by a four-quadrant detector 310. On the four-quadrant detector 310, an image of the distribution of the beam intensity is formed, which is modulated by the presence of the optical fiber 129. If the optical fiber 129 is not perfectly aligned, it undergoes a precession and oscillation motion, which is evidenced by the four-quadrant detector 310 as variations in the distribution of the laser beam intensity. By acting on the micropositioner 135 and/or the micropositioner 120, it is possible to finely align the optical fiber 128, 129 to be processed.

Preferably, a mechanism configured to impart a gradual extraction movement of the optical fiber 128, 129 from the (etchant fluid 110 contained in the) vessel 105 is provided, for example a translation stage with a stepped motor. In the drawings, such a mechanism is schematized as incorporated in the motor 130.

A light source 165 is advantageously provided, to which the optical fiber 128 to be processed is coupled at 167. The light source 165, e.g. a laser, injects into the optical fiber 128 a light beam, that propagates along the optical fiber 128 and 129 to the tip 170 thereof.

A first tip formation monitoring arrangement is provided, comprising a first microscope 140 associated with a first camera 150, e.g. a CCD camera, for monitoring the process of formation of an optical fiber probe tip (nanotip). The first camera 150 feeds a computer 160, e.g. a personal computer. The computer 160 is programmed to generate a time-lapse movie clip of the optical fiber tip formation process that allows a detailed investigation of the tip formation pathways. The first microscope 140 and associated first camera 150 collect a light beam 151 exiting through the tip 170 and transmitted along the optical fiber axis through the etchant liquid 110. An objective collects the light beam 151 exiting the tip 170 under formation, and directs it onto a photodetector. Preferably, an extra optical lens at the focal plane of the objective allows obtaining an image of the exiting light, which is focused onto the first CCD camera 150. The image of the light beam 151 exiting the tip 170 gives an approximate estimate of the quality and of the maximum size of the tip aperture.

Preferably, a second tip formation monitoring arrangement is provided, comprising a second microscope 145 associated with a second camera 155, e.g. a CCD camera, the second camera also feeding the computer 160. The second microscope 145 and associated second camera 155 collect a light beam 152 exiting through the tip 170 and propagating transversally to the optical fiber axis through the etchant liquid 110.

Alternatively or in combination with either the first or/and second tip formation monitoring arrangements, a third tip formation monitoring arrangement can also be provided, comprising a spectrometer 157 feeding the computer 160. The spectrometer 157 collects light 153 back-reflected at the tip 170 and back-propagating along the optical fiber 128.

In the vessel 105, an etchant liquid 110 is poured, e.g. an aqueous solution of HF. A protective overlayer 175 is then poured into the vessel 105, to form a layer that floats on top of the etchant liquid 110. The overlayer 175, which is less dense that the etchant liquid 110, is for example vegetable oil, or toluene or iso-octane, and serves to protect the optical fiber mounts from the corrosive HF vapor. The cap 125 with the guide member 127 is then mounted to the vessel 105, e.g. by screwing.

A terminal portion of the coated optical fiber 128 to be processed is stripped off its coatings to obtain the uncoated optical fiber portion 129, then the optical fiber 128, 129 is inserted into the guide member 127 so that the uncoated terminal portion 129 of the optical fiber 128 (where the nanotip 170 will be formed) passes through the hole at the bottom of the guide member 127 and is dipped into the etchant liquid 110. The other end of the optical fiber 128 is optically coupled to the light source 165 and to the spectrometer 157.

Through the micropositioner 120 and/or the micropositioner 135 the optical fiber 128, 129 is aligned to the vessel rotation axis (i.e., the vessel vertical axis Z).

The motor 115 is then activated and the vessel 105 is made to rotate around its vertical axis. In this way, the etchant liquid 110 is caused to rotate with respect to a static reference system.

The mechanism 130 for the extraction of the optical fiber from the vessel is also activated to cause a gradual extraction movement of the optical fiber 128, 129 from the etchant liquid 110 present in the vessel 105.

In an embodiment of the present invention, the relative rotational movement of the optical fiber 128, 129 with respect to the etchant liquid 110 comprises, in addition to the etchant liquid rotational movement component with respect to a static reference system, a material rod, in the present example an optical fiber rotational movement component with respect to said static reference system. The rotational movement is for example imparted to the optical fiber 128 by the motor 130.

The combination of etchant liquid rotational movement and material rod, in the present example the optical fiber, rotational movement leads to a situation like the Taylor-Couette flow. In such a case, different types of flow (laminar, turbulent, etc.) of the etchant liquid depend on the ratio of the optical fiber 129 radius to the vessel 105 radius, and the ratio of the respective angular speeds, the latter depending on the rotational speed of the motors 115 and 130, respectively. A desired type of flow can be established by designing the vessel 105 so to have a certain ratio of optical fiber 129 radius to the vessel 105 radius, and a certain ratio of the respective angular rotational speeds.

In such a case, different combinations of rotational movement are possible, as exemplified in FIG. 2, wherein in the four sketches on the right the external arrows schematize the etchant liquid rotational movement and the internal arrows schematize the optical fiber rotational movement. In particular, both the etchant liquid 110 (e.g., the vessel 105) and the optical fiber 128 can rotate clockwise or counter-clockwise, or the etchant liquid 110 (e.g., the vessel 105) can rotate clockwise while the optical fiber 128 can be rotated counter-clockwise, or viceversa.

According to an embodiment of the present invention, in order to evaluate the shape of the nanotip 170 while it is in the process of forming, the intensity distribution of light emitted and/or scattered and, possibly, reflected from the tip 170 of the optical fiber 129 is monitored.

After optical measurements have been calibrated in conjunction with SEM measurements, it is possible to reliably determine the diameter of the tip 170 of the optical fiber 129 by comparing the intensity distribution of the field pattern at the processed end face with that of a target, theoretically determined pattern.

Figure 4:
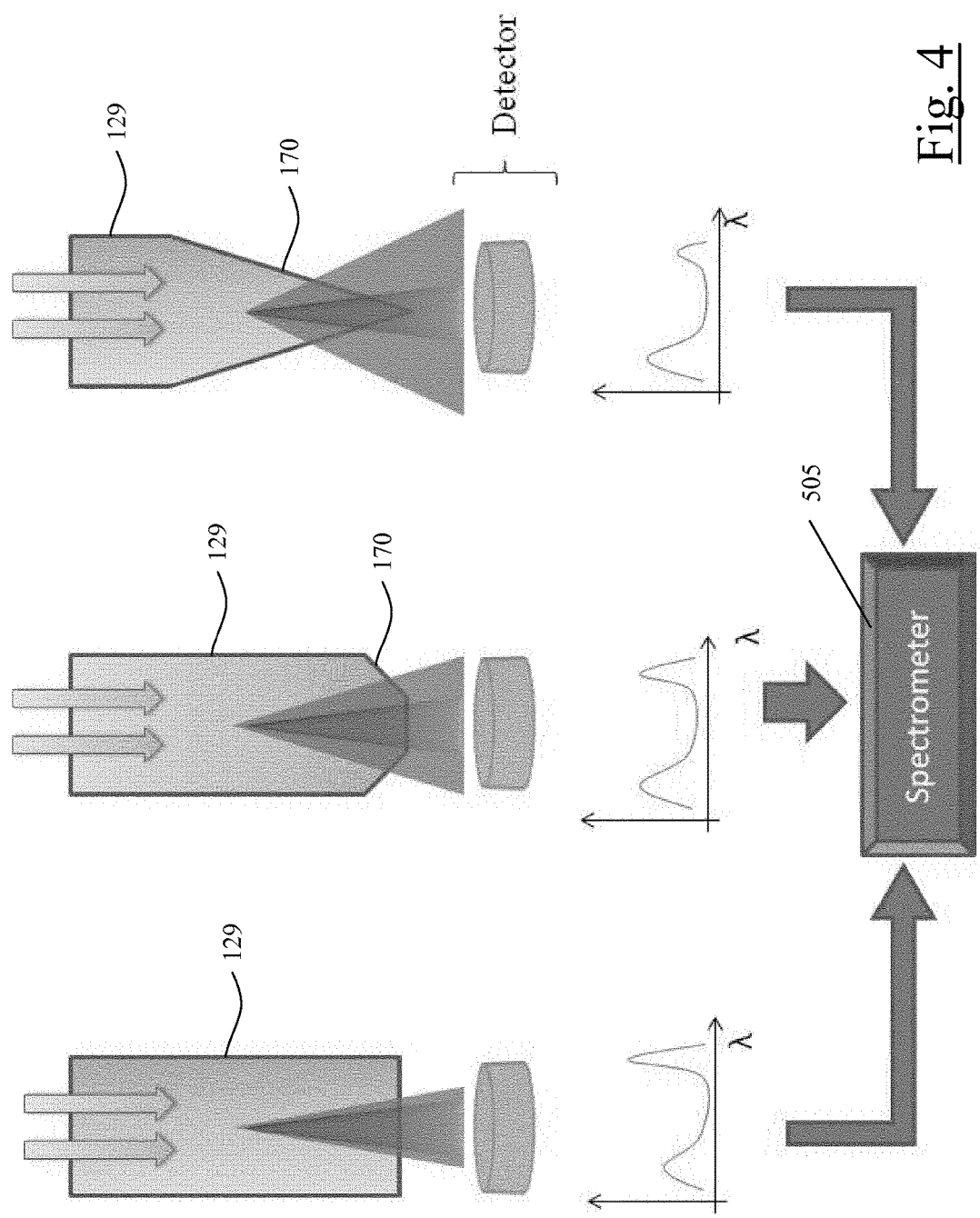
FIG. 4 schematizes the operation of a method of optically monitoring the formation of the nanotip of the optical fiber probe, according to an embodiment of the present invention.

As schematized in FIG. 4, assuming that an optical radiation at different wavelengths is propagated through the optical fiber 128, 129 (e.g., changing the laser source 165), the different wavelengths are differently diffracted at the tip 170 of the optical fiber 129, depending on the ratio of the wavelength to the dimension of the tip 170. Thus, as the size of the tip 170 varies during its formation, the shape of the optical spectrum acquired by a spectrometer 505 varies. The optical radiation exiting the tip 170 should be acquired by an optical acquisition set-up having a limited numerical aperture: in this way, when the red light cone becomes more and more open as the tip 170 is shaping, the optical acquisition set-up is able to record a reduction in the intensity of the longer wavelength light components, while the intensity of shorter wavelength light components remains relatively stable.

The optical radiation exiting the tip 170 can be captured by a GRIN lens, that acquires the optical radiation coming from a relatively narrow area of the tip 170 under formation, and, through optical fibers, the acquired optical radiation is transmitted to the spectrometer 505.

Such an analysis can be done on the transmitted light beam 151 and/or the scattered light beam 152 and/or the back-reflected light beam 153.

In other words, the tip formation process can be monitored by monitoring the change in the spectrum of the light beam transmitted and/or laterally scattered and/or back reflected at the tip 170.

Figure 5:
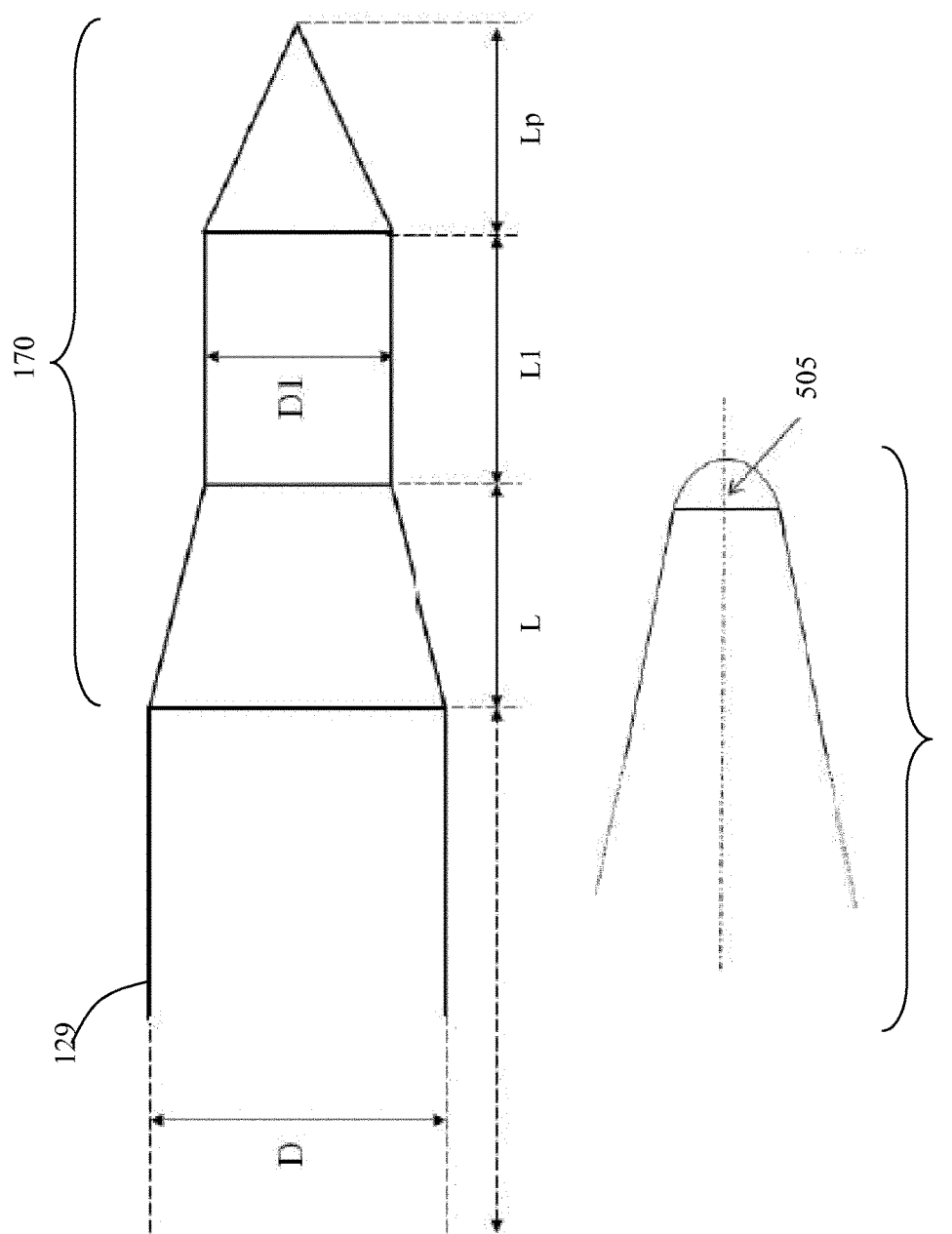
FIG. 5 is a sketch of an exemplary nanotip obtainable by means of a method according to an embodiment of the present invention.
Figure 6:
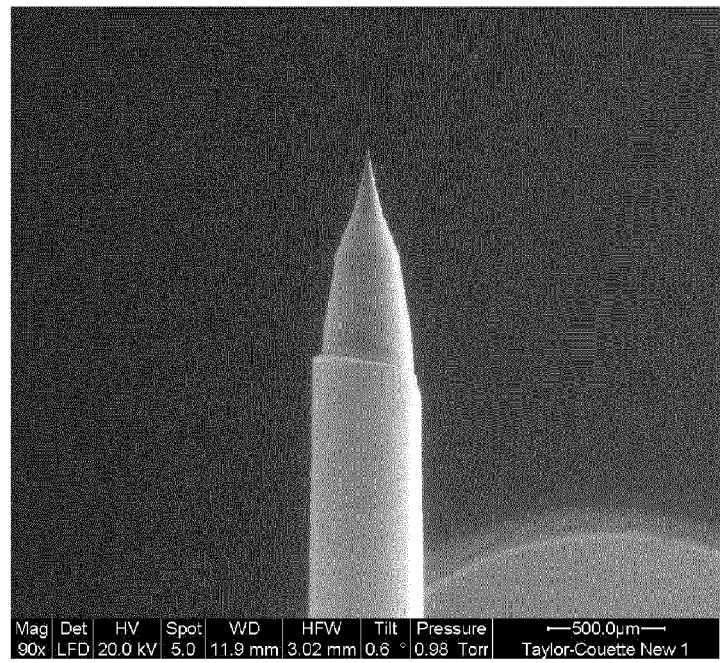
FIGS. 6-12 are SEM (Scanning Electron Microscope) microscope pictures of some nanotips obtained by a method according to an embodiment of the present invention.
Figure 7:
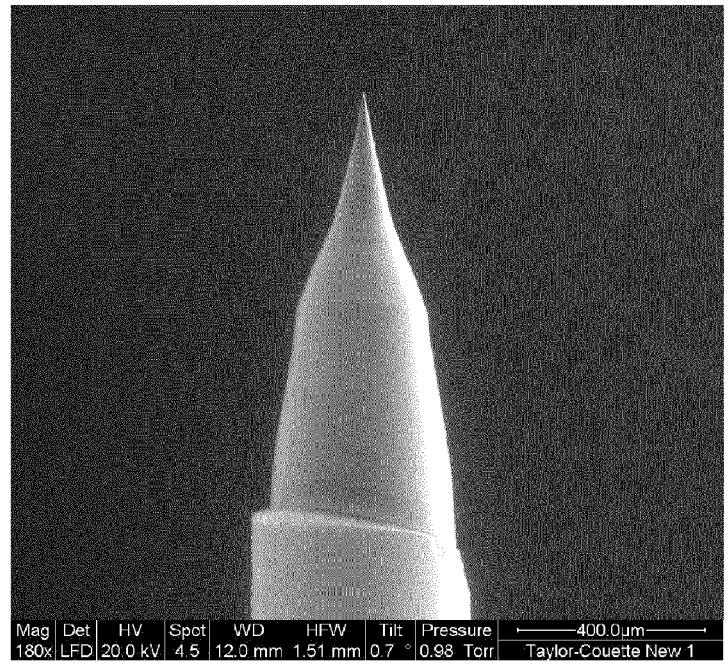
Figure 8:
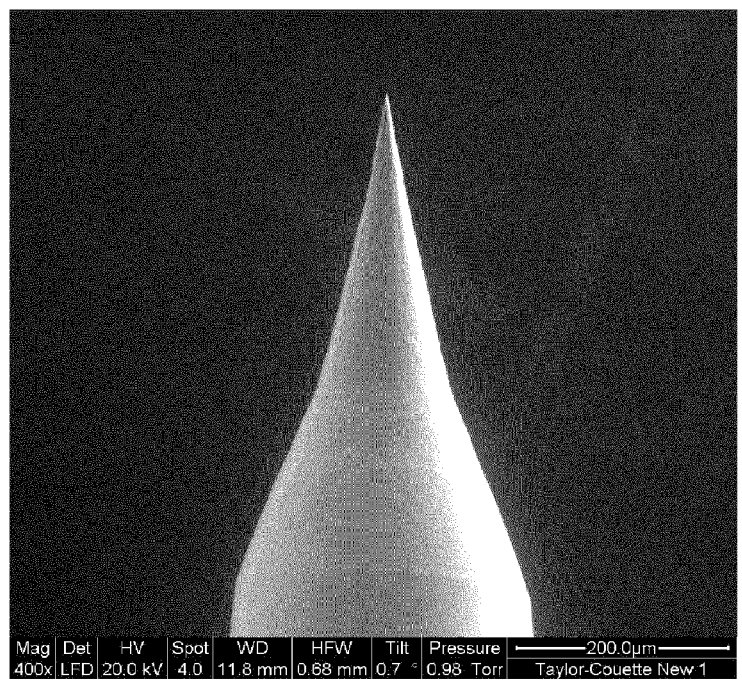
Figure 9:
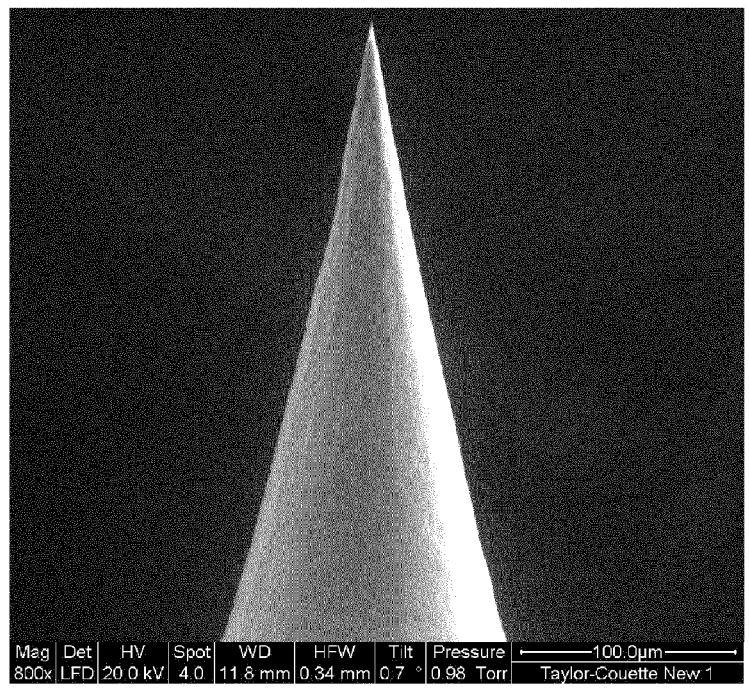
Figure 10:
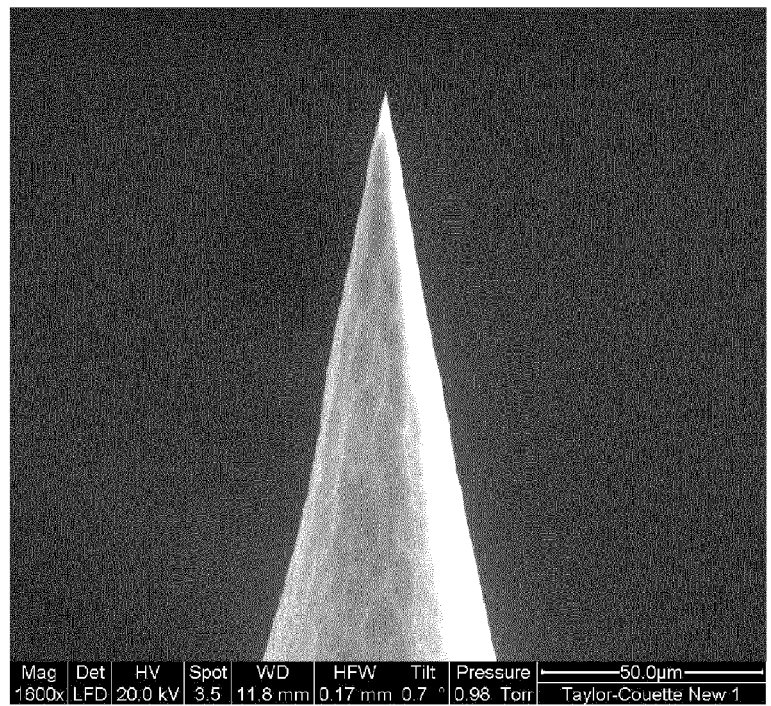
Figure 11:
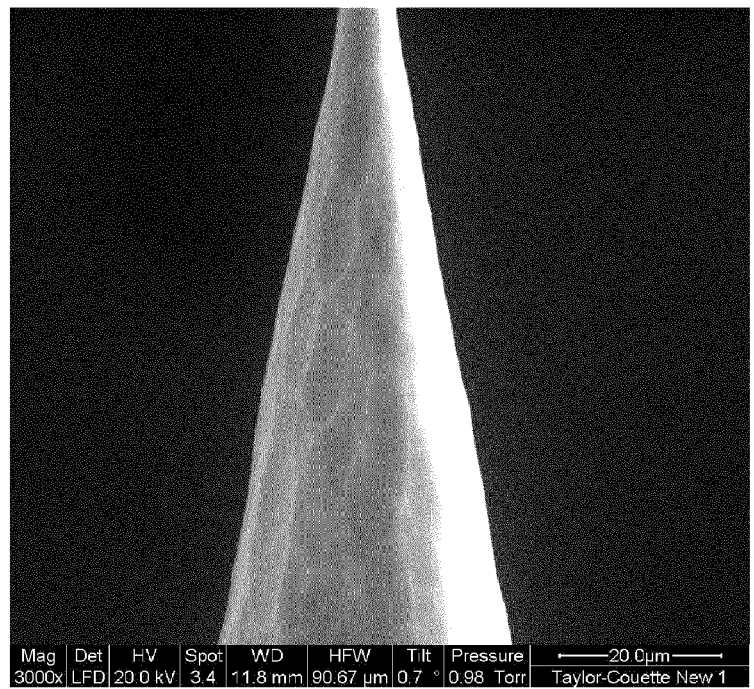
Figure 12:
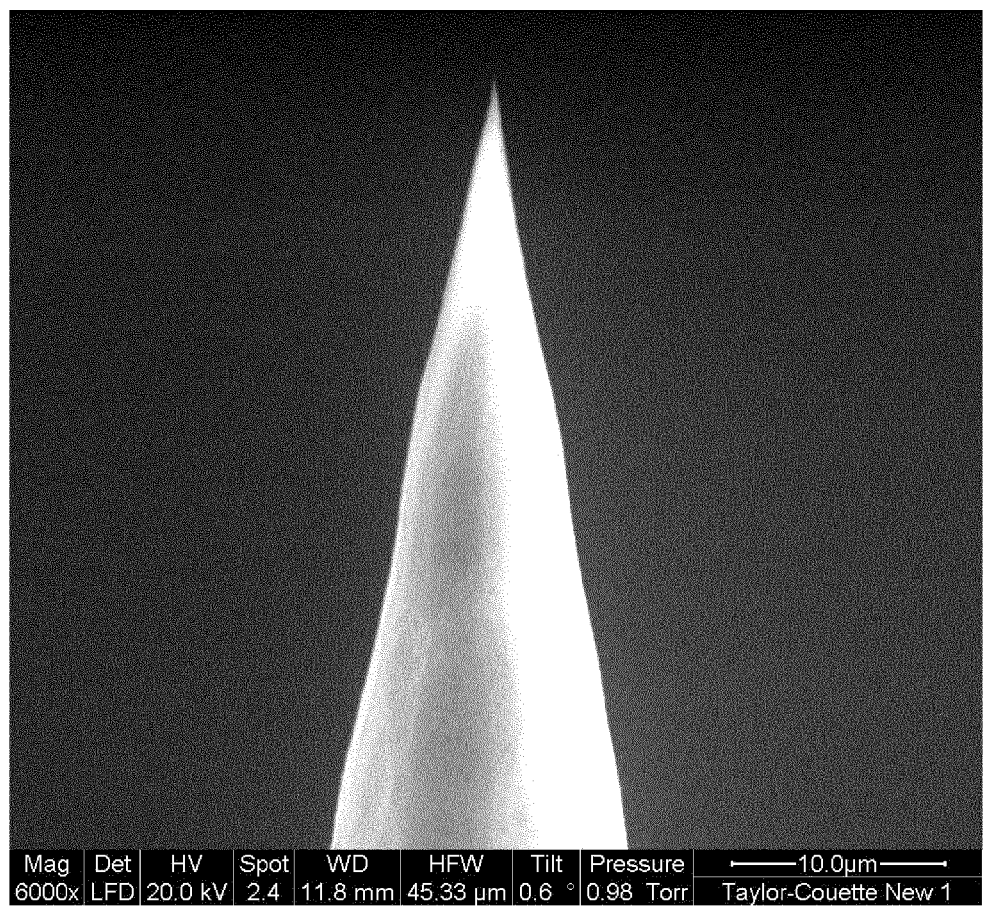

FIG. 5 is a sketch of the structure of a nanotip 170 produced by a method according to an embodiment of the present invention.

The parameters D, D1, L, L1, and Lp can be used to characterize the nanotip shape. The parameter D is the diameter of the bare (uncoated) optical fiber 129 (cladding and core, e.g. about 125 micron for a single-mode fiber); the parameter L is the length of the first tapered part of the nanotip 170; the parameter D1 is the diameter of the optical fiber just before the nanotip (from 400 microns to a few microns for a multimode optical fiber, and from 125 microns to a few microns for a single-mode fiber); L1 is the length of the tapered fiber (from 0 to few mm); Lp is the length of the nanotip (from 100 microns to some mm).

The nanotip final dimension is difficult to measure due to the limited resolution of the measurement instrument at this dimension. The radius of the normally curved final part 505 of the nanotip has been used to quantify the nanotip final dimension. Based on SEM measurements, the Applicant has estimated that nanotips as small as 37 nm (resolution limit of the instrument) can be produced.

The method according to an embodiment of the present invention allows to shape the optical fiber in different ways: the number of steps and the parameters L, L1, D1 and Lp can be chosen by the user in view of a particular application.

Some SEM pictures of nanotips that have been fabricated by the method according to the present invention are shown in the FIGS. 6-12.

Figure 13D:
FIGS. 13A-D schematically show a few possible shapes of nanotips that can be obtained by a method according to embodiments of the present invention.
Figure 13C:
Figure 13B:
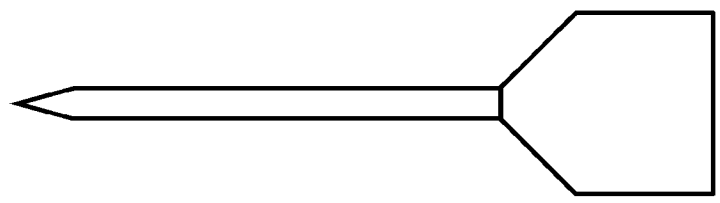
Figure 13A:

FIGS. 13A-D schematically shows a few possible shapes of nanotips that can be obtained by a method according to embodiments of the present invention: a triangular nanotip as in FIG. 13A, a "multi-step" nanotip as in FIG. 13B, a parabolic nanotip as in FIG. 13C, and an "hyperbolic" nanotip as in FIG. 13D.

The Applicant has carried on experimental trials using several different optical fibers, both single-mode and multi-mode, inter alia optical fibers commercialized by Corning, and particularly: SMF-28, inner core diameter about 8 microns; 3M: inner core diameter 3 microns; Nufern: inner core diameter 3 microns; 3M: inner core diameter 400 microns.

All the tested fibers yielded similar tips, all with extremely smooth glass surfaces after etching.

To investigate the influence of the concentration of hydro-fluoric acid (HF) in the aqueous hydrofluoric acid etchant solution 110, and etching liquid temperature on the taper quality and geometry, a series of etching experiments with dilute HF solutions at different temperatures was performed. No significant influence of the variation of HF concentration and temperature on the tip shape was observed: the features of the obtained tip are independent from environmental disturbances and HF concentration. The shape of the nanotip is thus the result of the combination of the mechanical movements (rotation of the etchant liquid and preferably gradual extraction of the optical fiber under processing from the etchant liquid). The rotation of the vessel 105 ensures a uniform etching process around the tip 170, while the velocity of extraction of the uncoated optical fiber 129 from the etchant shapes the angle of the nanotip.

At room temperature, the required etching time was about 40 minutes with 48% HF solution for a single-mode optical fiber with a diameter of 125 μm, increasing at lower concentration of HF. For a multi-mode optical fiber with a core diameter of 480 μm and with 48% HF solution, the required etching time is about 2 hours. Temperature fluctuations of a few degrees during etching did not show any influence on the resulting tips shape. The etching time depends on the speed of rotation of the (vessel 105 containing the) etchant liquid, decreasing as the rotation speed increases.

The possibility of controlling the smoothness of the nanotips so to obtain nanotips with very fine smoothness is nicely reflected in the quality of the subsequently deposited coating layer. A nanometric-scale roughness is in some applications a key point, e.g. to have an optimal coating deposition with metal or a chemical functionalization of the nanotip.

The applied metal coating is virtually free of side holes. Furthermore, the yield of usable tips after etching is more than 90%, compared to below 40% for the conventional method.

The action of the etchant liquid 110 also depends on the etchant liquid viscosity. In an embodiment of the present invention, the viscosity of the etchant liquid 110 can be changed in a controlled way. For example, magnetic nanoparticles can be mixed to the aqueous hydrofluoric acid solution, so that by applying from outside a magnetic field and modulating the intensity thereof it is possible to modulate the etchant fluid viscosity.

Embodiments of the present invention allow forming nanotips with an asymmetrical shape with predefined geometry requirements.

Figure 14A:
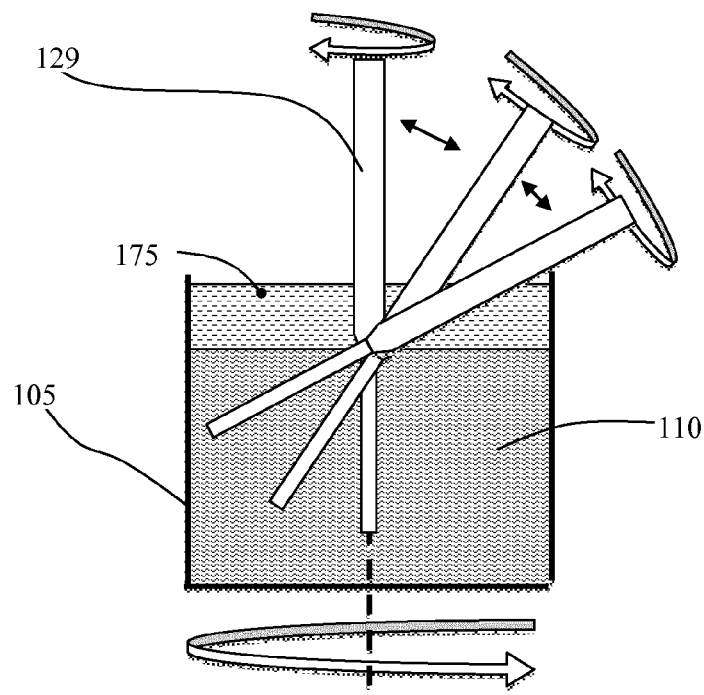
FIGS. 14A and 14B schematize methods of forming asymmetrical nanotips according to embodiments of the present invention, and FIGS. 15 and 16 schematize the application of the method according to the present invention for producing other types of structures, starting from material rods.

For example, while for obtaining symmetrical nanotips as described so far the optical fiber (more generally, the starting material rod) to be processed is dipped into the etchant liquid 110 with the optical fiber longitudinal axis orthogonal to the etchant liquid surface, by dipping the optical fiber with its axis slanted as schematized in FIG. 14A with respect to the surface of the etchant liquid 110 allows obtaining a variety of asymmetrical nanotips.

Figure 14B:
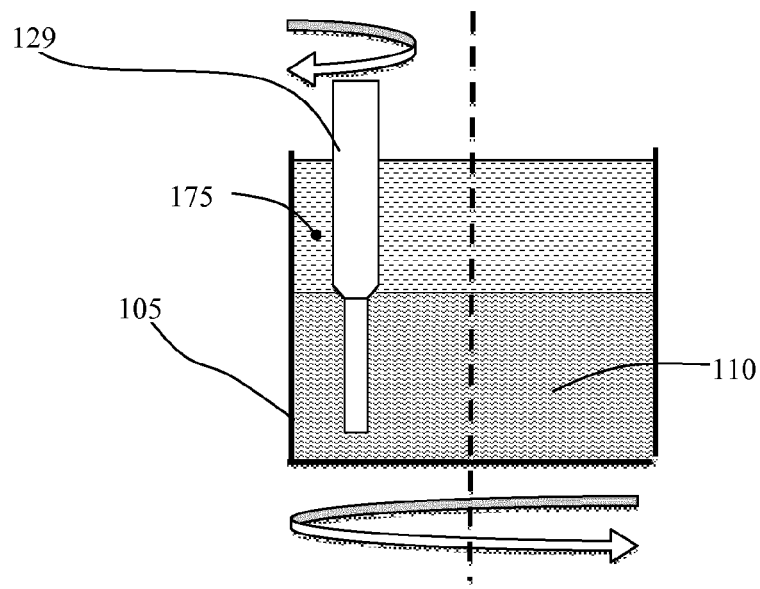

Another way for forming asymmetrical nanotips is dipping the optical fiber to be processed into the etchant liquid 110 with the optical fiber axis not aligned to (spaced apart from) the vertical axis Z of the vessel 105 containing the etchant liquid 110, as in FIG. 14B: as a result, the etchant liquid flows in a different way at the two sides of the optical fiber, and the meniscus between the etchant liquid and the optical fiber is different at the two sides of the optical fiber.

The method according to the present invention is not only advantageous for fabricating nanotips, e.g. for optical fiber nanoprobes: the technique according to the present invention is also advantageously applicable to the fabrication of other types of structures starting from material rods, particularly of millimetric/sub-millimetric size.

Figure 16:
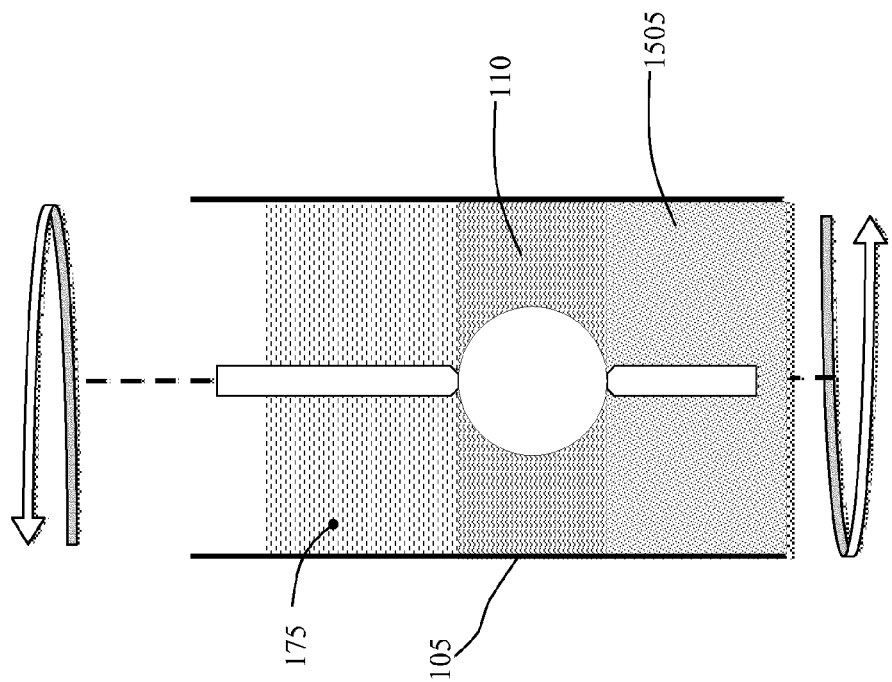
Figure 15:
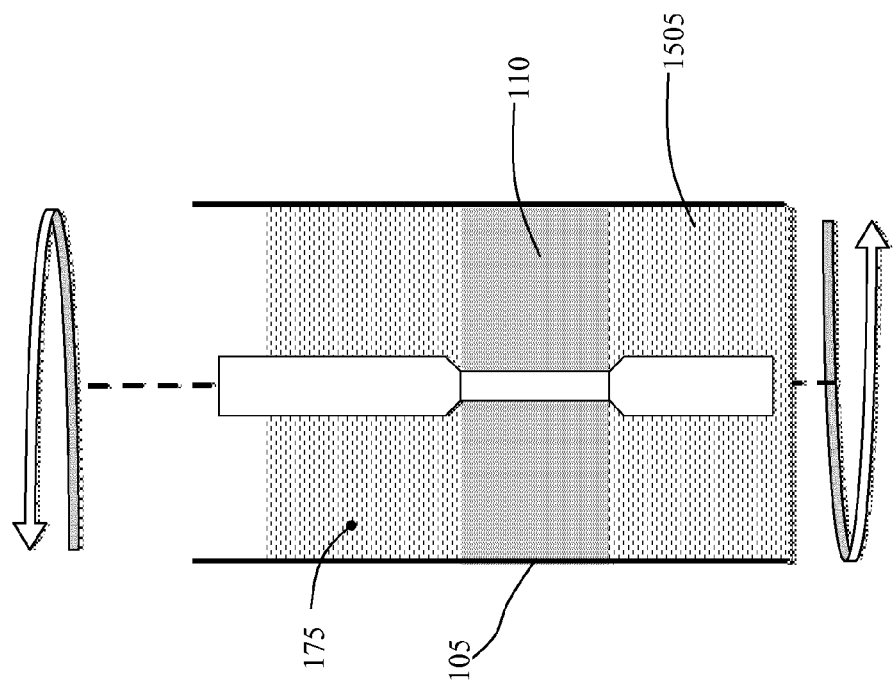

For example, as depicted in FIG. 15, an elongated structure with a reduced diameter portion, or an elongated structure with a bubble-shaped portion as in FIG. 16 can be produced. In order to fabricate these alternative structures, a suitable liquid, e.g. chloroform, is poured into the vessel 105 so as to form a sub-layer 1505, then the etchant solution 110, and then an over-layer 175 of, e.g., oil. The etchant 110 and, possibly, also the capillary are made to rotate, according to what described in the foregoing.

§§§§§

The method of the present invention is a highly reproducible and efficient method to produce, inter alia, high-definition near-field optical nanoprobes with a defined cone angle and nanometric roughness which reflects in a smooth, sidehole-free coating.

An advantage of embodiments of the invention described in the foregoing is that, usually, in order to evaluate the shape of a probe tip, there is no method other than SEM. This is a time consuming method and for optimal results requires not only a vacuum environment but also a metal coating treatment on the surface of the object. In addition to these requirements, electron beams might cause serious damage to tips.

The method according to embodiments of the present invention to evaluate the shape of a probe tip overcomes these problems, monitoring the intensity distribution of light emitted from the tip of an optical fiber. After optical measurements have been calibrated in conjunction with SEM measurements, it is possible to reliably determine the tip diameter of the optical fiber by comparing the intensity distribution of the field pattern at the processed end face with that of a predetermined pattern.

The invention claimed is:

1. A method of fabricating a nanostructure by chemical wet etching starting from a material rod of millimetric or sub-millimetric size, the method comprising:
   dipping an end portion (170) of the material rod (128,129) into a vessel (105) containing an etchant liquid (110) and a protective overlayer (175) floating on top of the etchant liquid,
   imparting a relative rotational movement of the etchant liquid with respect to the end portion (170) of the material rod immersed therein,
   characterized in that
   said imparting a relative rotational movement comprises imparting to the etchant liquid a rotational movement component with respect to a static reference system such that the etchant liquid flows in a direction opposite that of the rod.

2. The method of claim 1, further comprising:
while imparting to the etchant liquid said rotational movement component with respect to the static reference system, gradually extracting the end portion (170) of the material rod from the etchant liquid.

3. The method of claim 1, wherein said imparting a relative rotational movement of the etchant liquid (110) with respect to the end portion (170) of the material rod comprises imparting to the vessel (105) a rotational movement with respect to said static reference system.

4. The method of claim 3, wherein said imparting a relative rotational movement of the etchant liquid (110) with respect to the end portion (170) of the material rod comprises imparting to the material rod a rotational movement with respect to said static reference system.

5. The method of claim 1, wherein said material rod is immersed into the etchant liquid with a longitudinal axis of the material rod essentially coaxial with a rotation axis of the etchant liquid with respect to said static reference system.

6. The method of claim 1, wherein said material rod is immersed into the etchant liquid with a longitudinal axis of the material rod essentially parallel but not coaxial with a rotation axis of the etchant liquid with respect to said static reference system.

7. The method of claim 1, wherein said material rod is immersed into the etchant liquid with a longitudinal axis of the material rod slanted with respect to a rotation axis of the etchant liquid with respect to said static reference system.

8. The method of claim 1, wherein the material rod is an optical fiber (128,129), and further comprising:
propagating an optical radiation through the optical fiber;
detecting a transmitted and/or scattered and/or back-reflected optical radiation, respectively transmitted and/or scattered and/or back-reflected at an optical fiber tip (170) of the optical fiber immersed in the etchant liquid to monitor a process of formation of said tip.

9. The method of claim 8, wherein said detecting the transmitted and/or scattered and/or back-reflected optical radiation comprises comparing an intensity of the transmitted and/or scattered and/or back-reflected optical radiation to predetermined patterns.

10. A method of fabricating a nanostructure by chemical wet etching starting from a material rod of millimetric or sub-millimetric size, the method comprising:
dipping an end portion (170) of the material rod (128,129) into a vessel (105) containing an etchant liquid (110) and a protective overlayer (175) floating on top of the etchant liquid,
imparting a relative rotational movement of the etchant liquid with respect to the end portion (170) of the material rod immersed therein,
characterized in that:
said imparting a relative rotational movement comprises imparting to the etchant liquid a rotational movement component with respect to a static reference system; and
dipping the end portion of the material rod includes immersing the material rod into the etchant liquid with a longitudinal axis of the material rod slanted with respect to a rotation axis of the etchant liquid with respect to said static reference system.

11. A method of fabricating a nanostructure by chemical wet etching starting from a material rod of millimetric or sub-millimetric size, the method comprising:
dipping an end portion (170) of the material rod (128,129) into a vessel (105) containing an etchant liquid (110) and a protective overlayer (175) floating on top of the etchant liquid, wherein the material rod is an optical fiber,
imparting a relative rotational movement of the etchant liquid with respect to the end portion (170) of the material rod immersed therein,
propagating an optical radiation through the optical fiber,
detecting a transmitted and/or scattered and/or back-reflected optical radiation, respectively transmitted and/or scattered and/or back-reflected at an optical fiber tip (170) of the optical fiber immersed in the etchant liquid to monitor a process of formation of said tip,
characterized in that:
said imparting a relative rotational movement comprises imparting to the etchant liquid a rotational movement component with respect to a static reference system, and
detecting the transmitted and/or scattered and/or back-reflected optical radiation comprises comparing an intensity of the transmitted and/or scattered and/or back-reflected optical radiation to predetermined patterns.

* * * * *